United States Patent
Tanigawa

(10) Patent No.: US 7,250,981 B2
(45) Date of Patent: Jul. 31, 2007

(54) VIDEO SIGNAL PROCESSOR AND VIDEO SIGNAL PROCESSING METHOD WHICH INTERPOLATE A VIDEO SIGNAL USING AN INTERPOLATION FACTOR BASED ON PHASE INFORMATION OF A SELECTED CLOCK

(75) Inventor: Satoru Tanigawa, Kawanishi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 562 days.

(21) Appl. No.: 10/764,439

(22) Filed: Jan. 27, 2004

(65) Prior Publication Data

US 2004/0212742 A1    Oct. 28, 2004

(30) Foreign Application Priority Data

Jan. 27, 2003    (JP)    ............... 2003-017812

(51) Int. Cl.
*H03L 7/00*    (2006.01)
*H04N 3/27*    (2006.01)

(52) U.S. Cl. ............... 348/537; 348/554; 348/541; 348/607

(58) Field of Classification Search ............... 348/194, 348/501, 511, 512, 536–538, 540, 541, 554, 348/555, 607, 445, 718; 345/213
See application file for complete search history.

(56) References Cited

U.S. PATENT DOCUMENTS

| | | | |
|---|---|---|---|
| 4,503,453 A | * | 3/1985 | Rougeolle et al. ........... 348/538 |
| 4,922,118 A | * | 5/1990 | Maeshima ................... 348/458 |
| 5,121,207 A | * | 6/1992 | Herrmann .................... 348/573 |
| 5,877,641 A | | 3/1999 | Ziegler et al. |
| 5,929,923 A | * | 7/1999 | Yamauchi et al. ........... 348/538 |
| 6,005,557 A | * | 12/1999 | Wong ........................ 345/204 |
| 6,128,357 A | * | 10/2000 | Lu et al. ..................... 375/355 |
| 6,211,918 B1 | * | 4/2001 | Uwabata et al. ............ 348/458 |
| 6,304,296 B1 | * | 10/2001 | Yoneno ...................... 348/537 |
| 6,369,627 B1 | | 4/2002 | Tomita |
| 6,778,170 B1 | * | 8/2004 | Shu et al. ................... 345/213 |
| 2001/0005156 A1 | | 6/2001 | Dosho |
| 2002/0018145 A1 | * | 2/2002 | Howald et al. ............. 348/538 |

FOREIGN PATENT DOCUMENTS

JP    2002-290218    10/2002

* cited by examiner

*Primary Examiner*—Victor R. Kostak
(74) *Attorney, Agent, or Firm*—Wenderoth, Lind & Ponack, L.L.P.

(57) ABSTRACT

A video signal processor and a video signal processing method which can prevent the length of one period of a clock from being shortened and can output a video signal that is in phase with a reference signal. When a video data signal that has been processed using a first clock signal is processed using a second clock signal, this video signal processor does not utilize as the second clock signal, a clock signal that is in phase with a reference signal but a clock signal that is employed in a later stage signal processor, and interpolates the video data signal by an interpolation circuit so as to make the signal in phase with the reference signal.

5 Claims, 8 Drawing Sheets

VIDEO SIGNAL PROCESSOR AND VIDEO SIGNAL PROCESSING METHOD WHICH INTERPOLATE A VIDEO SIGNAL USING AN INTERPOLATION FACTOR BASED ON PHASE INFORMATION OF A SELECTED CLOCK

FIELD OF THE INVENTION

The present invention relates to a video signal processor and a video signal processing method, which are employed to convert a video data signal in a first clock processing into a video data signal in a second clock processing.

BACKGROUND OF THE INVENTION

In recent years, with increase of functions of television receivers and enhancement of the image quality, a digital video signal processing technology has been more and more utilized, and accordingly greater importance has been put on video signal processors that can make video signals to be synchronized with various clock signals.

Hereinafter, a conventional video signal processor will be described with reference to FIG. 8. FIG. 8 is a block diagram schematically illustrating a structure of a conventional video signal processor.

In FIG. 8, a video data signal S100 including video data is inputted to this video signal processor through a video signal input terminal 100. A first clock signal S101 is inputted through a clock input terminal 101. A second clock signal S102 is inputted through a clock input terminal 102. A reference signal S103 indicating a start position of screen display, such as a horizontal sync signal, is inputted through a reference signal input terminal 103.

In FIG. 8, delay elements 104 to 107 can vary respective delay values. When control of the delay values (which will be described later) is completed, the delay element 104 phase shifts the second clock signal S102 by ¼ clock (i.e., one-fourth of the period of the clock), and the delay elements 105, 106, and 107 each phase shift a delayed clock from the immediately preceding delay element by ¼ clock. A selector 108a selects a delayed clock that is the most synchronized with the reference signal S103 from among the delayed clocks S104 to S107 which have been delayed by the respective delay elements 104 to 107, and outputs the selected clock as a second clock signal S108a. A phase comparator 112 compares phases between a clock that is obtained by delaying a focus clock in the second clock signal S102 by one clock using the delay elements 104 to 107, and a clock that is one clock later than the focus clock. A control circuit 113 outputs a control signal S113 for controlling the respective delay values of the delay elements 104 to 107 on the basis of a phase difference output S112 from the phase comparator 112.

In FIG. 8, a memory 110a utilizes the first clock signal S101 for writing a video data signal S100 and the second clock signal S108a for reading an output video data signal S110a. The output video data signal S110a is outputted through a video signal output terminal 114, and the second clock signal S108a is outputted through a clock output terminal 115.

The operation of the conventional video signal processor that is constructed as described above will be described.

When the video data signal S100 including video data is inputted through the video signal input terminal 100 and the first clock signal S101 is inputted through the clock input terminal 101, the video data are stored in the memory 110a in accordance with the first clock signal S101.

The second clock signal S102 inputted through the clock input terminal 102 is delayed successively by ¼ clock, by the delay elements 104 to 107, respectively.

The delayed clock S107 is inputted from the delay element 107 to the phase comparator 112 as a comparison signal, and a clock that is one clock later than the clock inputted through the clock input terminal 102 is inputted to the phase comparator 112 as a signal to be compared with the comparison signal (hereinafter, referred to as a to-be-compared signal). The phase comparator 112 compares the phases between the comparison signal and the to-be-compared signal, thereby detecting a phase difference, and outputs a phase difference output S112 to the control circuit 113. The control circuit 113 outputs a control signal S113 for controlling the respective delay values of the delay elements 104 to 107 on the basis of the phase difference output S112.

When this operation for controlling the respective delay values of the delay elements 104 to 107 on the basis of the phase difference between the delayed clock S107 that is obtained by delaying the second clock signal S102 by one clock and the clock that is one clock later than the second clock signal S102 is repeatedly performed until the phase comparator 112 detects no phase difference, the delay values of the delay elements 104 to 107 become approximately the same. At this time, the respective delay elements 104 to 107 output the delayed clocks S104 to S107 which are obtained by delaying the second clock signal S102 successively by ¼ clock.

These delayed clocks S104 to S107 which are phase shifted with each other by ¼ clock are inputted to the selector 108a, respectively. The selector 108a selects one of the delayed clocks S104 to S107, which is the most synchronized with the reference signal S103 inputted through the reference signal input terminal 103, and supplies the selected delayed clock to the memory 110a as a second clock signal S108a as well as outputs the same through the clock output terminal 115.

On the other hand, the video data written in the memory 110a are read as an output video data signal S110a in accordance with the second clock signal S108a, and outputted through the video signal output terminal 114. At this time, the clock for the output video data signal S110a is switched from the first clock signal S101 to the second clock signal S108a that is in phase with the reference signal S103. (See Japanese Published Patent Application No. 2002-290218, pp. 7-10, FIGS. 1, 2)

However, since the conventional video signal processor changes the clock so as to be in phase with the reference signal, the length of one period of the clock varies at the changing. For example, as shown in FIG. 9, when the clock is switched from clock CK2 to clock CK1, the period of the clock is shortened at the changing. When one period of the clock becomes a length that is not within a specified range or when the period of the clock is shortened, an arithmetic error may occur in the video signal processor, or an arithmetic unit that is connected at a later stage of the video signal processor and utilizes the second clock signal S108a outputted from the clock output terminal 115, resulting in disturbances in a displayed picture or malfunction of the apparatus.

SUMMARY OF THE INVENTION

The present invention has for its object to provide a video signal processor and a video signal processing method, which can output a video signal to be in phase with the reference signal while preventing the period of the clock from being shortened.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a 1st aspect of the present invention, there is provided a video signal processor comprising: a memory that utilizes a first clock signal for writing a video data signal and a second clock signal for reading a video data signal; a delay unit, including plural delay elements, for delaying the second clock signal; a selector for selecting a clock that is most synchronized with a reference signal inputted from outside, from among clocks that have been delayed using the respective delay elements of the delay unit, and outputting phase information of the selected clock; an interpolation factor output unit for converting the phase information into an interpolation factor, and outputting the interpolation factor; and an interpolator for interpolating the video data signal read from the memory in accordance with the second clock signal using the interpolation factor. Therefore, it is possible to prevent one period of the clock from becoming a length that is not within a specified range in selecting a clock so as to be in phase with the reference signal. Further, it is possible to avoid an arithmetic error or malfunction in the video signal processor or in a later stage apparatus, which would otherwise arise due to shortening of the period of the clock.

According to a 2nd aspect of the present invention, there is provided a video signal processor comprising: a memory that utilizes a first clock signal for writing a video data signal and a second clock signal for reading a video data signal; a delay unit, including plural delay elements that can vary respective delay values, for delaying the second clock signal by one period of the second clock signal; a phase comparator for comparing phases between a clock that is obtained by delaying a focus clock in the second clock signal by one clock using the delay unit, and a clock that is one clock later than the focus clock; a controller for controlling respective delay values of the delay elements of the delay unit on the basis of a phase difference detected by the phase comparator; a selector for selecting a clock that is most synchronized with a reference signal inputted from outside, from among clocks that have been delayed by the respective delay elements of the delay unit, and outputting phase information of the selected clock; an interpolation factor output unit for converting the phase information into an interpolation factor, and outputting the interpolation factor; and an interpolator for interpolating the video data signal read from the memory in accordance with the second clock signal using the interpolation factor. Therefore, even when there are temperature variations or abrupt changes in the reference signal, it is possible to keep constant the frequencies of the clocks that are outputted from the respective delay elements. In addition, it is possible to prevent one period of the clock from becoming a length that is not within a specified range in selecting a clock so as to be in phase with the reference signal. Further, it is possible to avoid an arithmetic error or malfunction in the video signal processor or in a later stage apparatus, which would otherwise arise due to shortening of the period of the clock.

According to a 3rd aspect of the present invention, there is provided a video signal processor comprising: a memory that utilizes a first clock signal for writing or reading a video data signal; a delay unit, including plural delay elements, for delaying the first clock signal; a selector for selecting a clock that is most synchronized with a reference signal inputted from outside, from among clocks that have been delayed using the respective delay elements of the delay unit, and outputting phase information of the selected clock; an interpolation factor output unit for converting the phase information into an interpolation factor, and outputting the interpolation factor; and an interpolator for interpolating the video data signal read from the memory in accordance with the first clock signal using the interpolation factor. Therefore, it is possible to prevent one period of the clock from becoming a length that is not within a specified range in selecting a clock so as to be in phase with the reference signal. Further, it is possible to avoid an arithmetic error or malfunction in the video signal processor or in a later stage apparatus, which would otherwise arise due to shortening of the period of the clock.

According to a 4th aspect of the present invention, there is provided a video signal processor comprising: a memory that utilizes a first clock signal for writing or reading a video data signal; a delay unit, including plural delay elements that can vary respective delay values, for delaying the first clock signal by one period of the first clock signal; a phase comparator for comparing phases between a clock that is obtained by delaying a focus clock in the first clock signal by one clock using the delay unit, and a clock that is one clock later than the focus clock; a controller for controlling the respective delay values of the delay elements of the delay unit on the basis of a phase difference detected by the phase comparator; a selector for selecting a clock that is most synchronized with a reference signal inputted from outside, from among clocks that have been delayed by the delay elements of the delay unit, and outputting phase information of the selected clock; an interpolation factor output unit for converting the phase information into an interpolation factor, and outputting the interpolation factor; and an interpolator for interpolating the video data signal read from the memory in accordance with the first clock signal using the interpolation factor. Therefore, even when there are temperature changes or abrupt changes in the reference signal, it is possible to keep constant the frequencies of the clocks that are outputted from the delay elements. Further, it is possible to prevent one period of the clock from becoming a length that is not within a specified range in selecting a clock so as to be in phase with the reference signal. Further, it is possible to avoid an arithmetic error or malfunction in the video signal processor or in a later stage apparatus, which would otherwise arise due to shortening of the period of the clock.

According to a 5th aspect of the present invention, there is provided a video signal processing method including the steps of: writing a video data signal into a memory in accordance with a first clock signal; delaying a second clock signal using plural delay elements; selecting a clock that is most synchronized with a reference signal inputted from outside, from among clocks that have been delayed by the delay elements, and generating phase information of the selected clock; converting the phase information into an interpolation factor; and interpolating the video data signal read from the memory in accordance with the second clock signal using the interpolation factor. Therefore, it is possible to prevent one period of the clock from becoming a length that is not within a specified range in selecting a clock so as to be in phase with the reference signal. Further, it is possible to avoid an arithmetic error or malfunction in the video signal processor or in a later stage apparatus, which would otherwise arise due to shortening of the period of the clock.

DETAILED DESCRIPTION OF THE PREFERRED EMBODIMENTS

Hereinafter, embodiments of the present invention will be described with reference to the drawings. The embodiments described herein are exemplary only and the present invention is not limited to these embodiments.

Embodiment 1

A video signal processor and a video signal processing method according to a first embodiment of the present invention will be described.

Figure 1:
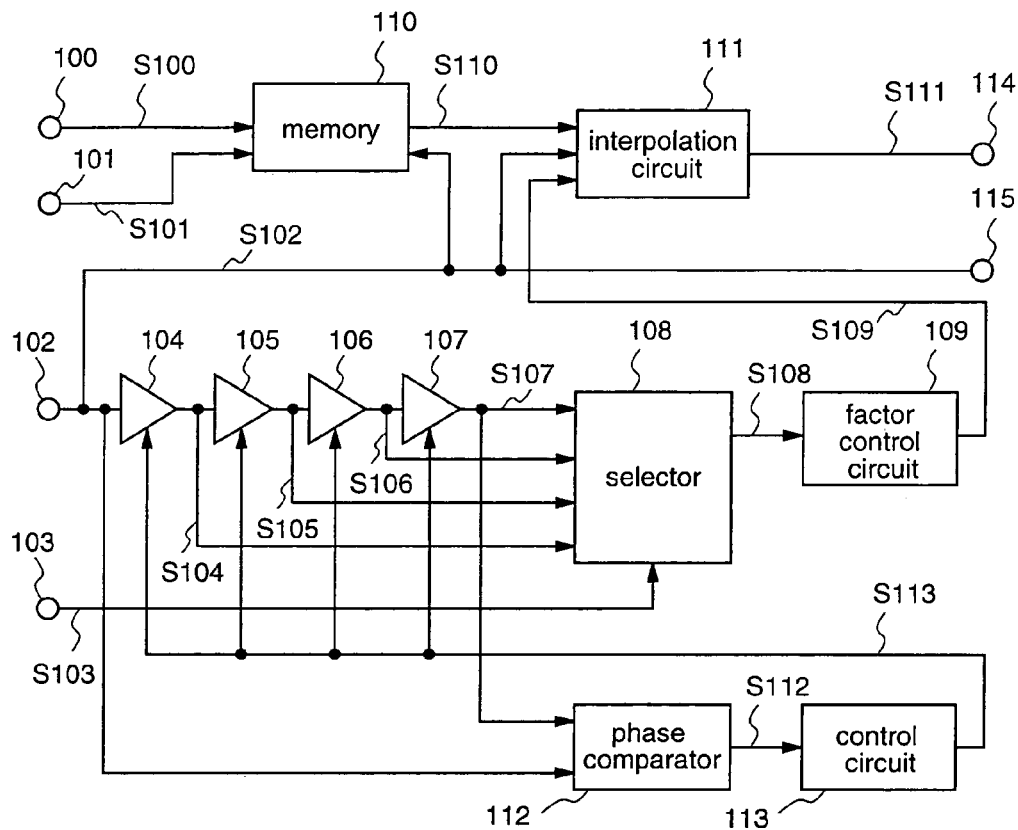
FIG. 1 is a block diagram illustrating a structure of a video signal processor according to a first embodiment of the present invention.

FIG. 1 is a block diagram illustrating a structure of a video signal processing apparatus according to the first embodiment.

In FIG. 1, a video data signal S100 including video data is inputted to the video signal processor through a video signal input terminal 100. A first clock signal S101 is inputted through a clock input terminal 101. A second clock signal S102 is inputted through a clock input terminal 102. A reference signal S103 indicating a screen display start position, such as a horizontal sync signal, is inputted through a reference signal input terminal 103.

In FIG. 1, plural delay elements 104 to 107 can vary respective delay values. When control of the delay values (which will be described later) is completed, the delay element 104 phase shifts the second clock signal S102 inputted through the clock input terminal 102 by ¼ clock (i.e., one-fourth of the period of the clock), and the delay elements 105, 106, and 107 each phase shift a delayed clock inputted from the immediately preceding delay element by ¼ clock, respectively. A selector 108 selects a delayed clock that is the most synchronized with the reference signal S103 from among the delayed clocks S104 to S107 which have been delayed by the respective delay elements 104 to 107, and outputs phase information S108 of the selected delayed clock to a factor control circuit 109. The factor control circuit 109 outputs an interpolation factor S109 for an output video data signal S110 on the basis of the phase information S108. A phase comparator 112 compares phases between a clock that is obtained by delaying a focus clock in the second clock signal S102 by one clock using the delay elements 104 to 107, and a clock that is one clock later than the focus clock. A control circuit 113 outputs a control signal S113 for controlling the respective delay values of the delay elements 104 to 107 on the basis of a phase difference output S112 outputted from the phase comparator 112. Here, these delay elements 104 to 107 in series correspond to delay units as defined in claims of the present invention. Further, the factor control circuit 109 corresponds to an interpolation factor output unit as defined in claims of the present invention.

In FIG. 1, writing and reading into/from a memory 110 can be performed independently. This memory 110 utilizes the first clock signal S101 for writing the video data signal S100 and the second clock signal S102 for reading the output video data signal S110. An interpolation circuit 111 interpolates the output video data signal S110 using the interpolation factor S109. The output video data signal S111 that has been interpolated by the interpolation circuit 111 is outputted through a video signal output terminal 114, and the second clock signal S102 is outputted through a clock output terminal 115.

Figure 2:
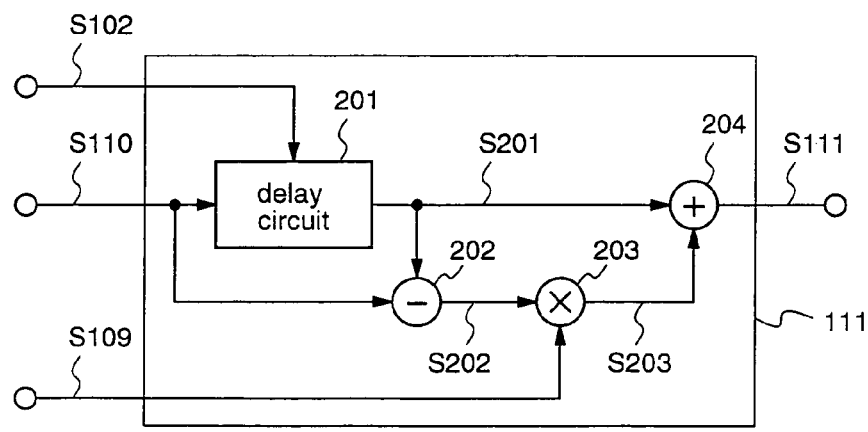
FIG. 2 is a block diagram illustrating a structure of an interpolation circuit in the video signal processor according to the first embodiment.

FIG. 2 is a diagram illustrating a structure of the interpolation circuit 111. The same reference numerals as those in FIG. 1 denote the same or corresponding components.

As shown in FIG. 2, the interpolation circuit 111 includes a delay circuit 201 for delaying the output video data signal S110 read from the memory 110 in accordance with the second clock signal S102, by a time corresponding to one period of the second clock signal S102, a subtraction circuit 202 for subtracting a delay circuit output signal S201 from the output video data signal 110, a multiplication circuit 203 for multiplying a subtraction circuit output signal S202 by the interpolation factor S109, and an addition circuit 204 for adding the delay circuit output signal S201 and a multiplication circuit output signal S203.

Figure 3:
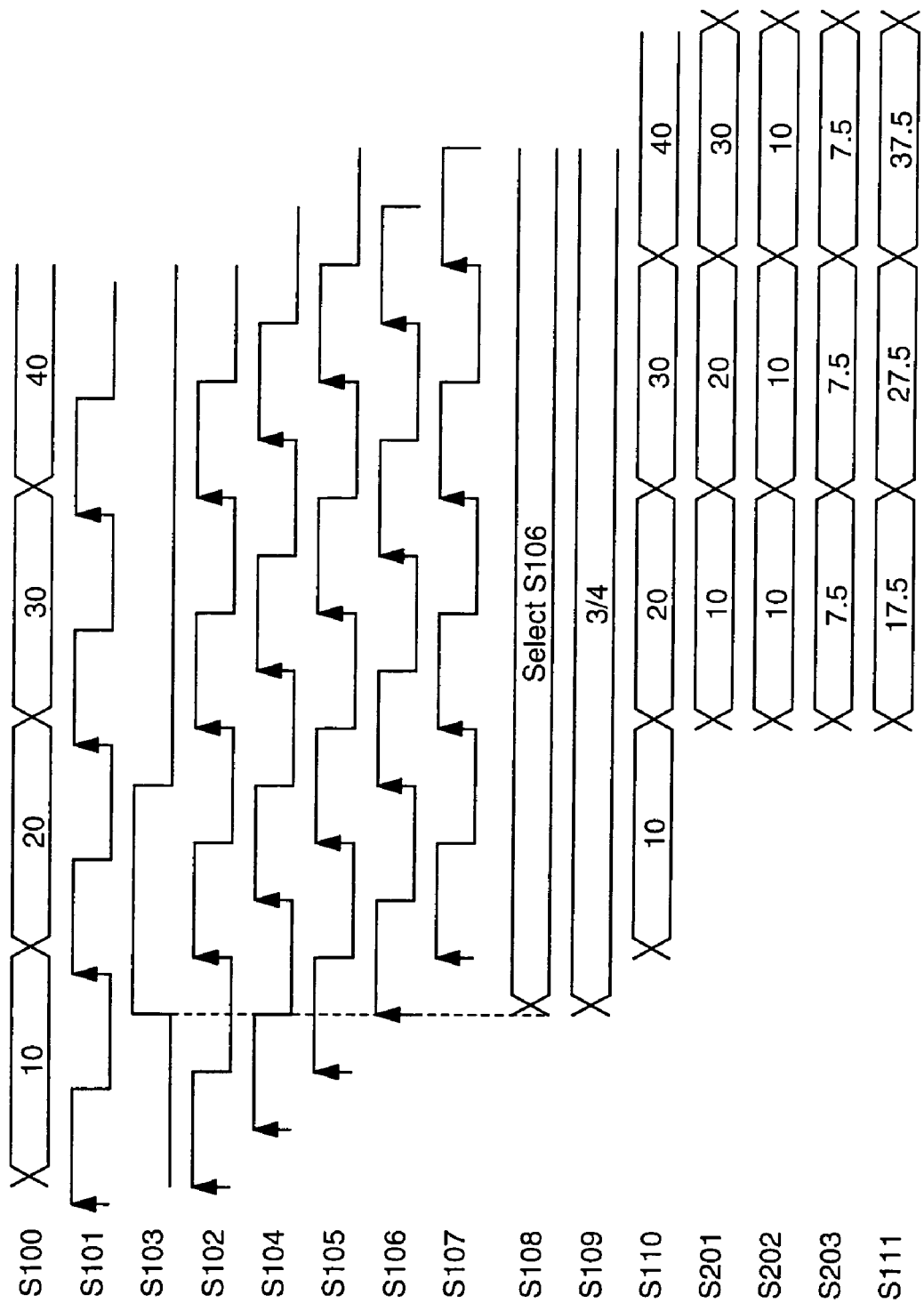
FIG. 3 is a timing chart explaining an operation of the video signal processor according to the first embodiment.

The operation of the video signal processor constructed as described above, and the video signal processing method will be described with reference to FIGS. 1 to 3. FIG. 3 is a timing chart for explaining the operation of the video signal processor according to the first embodiment, and shows signal levels of the respective signals shown in FIGS. 1 and 2. In FIG. 3, reference numerals 10, 20, 30 and the like denote video data indicating the brightness, color, density and the like of the picture.

When the video data signal S100 including video data is inputted through the video signal input terminal 100 and the first clock signal S101 is inputted through the clock input terminal 101, the video data are stored in the memory 110 in accordance with the first clock signal S101.

The second clock signal S102 is inputted through the clock input terminal 102. The second clock signal S102 is a clock at a desired frequency, and for example a clock at the same frequency as that of a clock that is used in a different arithmetic unit connected at a later stage of the video signal processor is employed. The second clock signal S102 is inputted to the delay element 104 and the memory 110, as well as outputted from the clock output terminal 115.

The second clock signal S102 inputted to the delay element 104 is delayed successively by the delay elements 104 to 107, resulting in a delayed clock S107, which is obtained by delaying the second clock signal S102 by approximately one clock.

This delayed clock S107 is inputted to the phase comparator 112 as a comparison signal, while the a clock that is one clock later than the clock inputted to the clock input terminal 102 is inputted to the phase comparator 112 as a signal to be compared (hereinafter, referred to as a to-be-compared signal). The phase comparator 112 compares the comparison signal and the to-be-compared signal, thereby detecting a phase difference, and outputs a phase difference output S112 to the control circuit 113. The control circuit 113 outputs a control signal S113 for controlling the respective delay values of the delay elements 104 to 107 on the basis of the phase difference output S112.

When this operation for controlling the respective delay values of the delay elements 104 to 107 on the basis of the phase difference between the delayed clock S107 that is obtained by delaying the second clock signal S102 by one clock, and the clock that is one clock later than the second clock signal S102 is repeatedly performed until the phase comparator 112 detects no phase difference, the delay values of the delay elements 104 to 107 become approximately the same. At this time, the delay elements 104 to 107 output the delayed clocks that are shifted in phase with each other by ¼ clock, respectively. More specifically, the delay element 104 outputs a delayed clock S104 that is obtained by delaying the second clock signal S102 by ¼ clock, the delay element 105 outputs a delayed clock S105 that is obtained by delaying the second clock signal S102 by ²⁄₄ clock, the delay element 106 outputs a delayed clock S106 that is obtained by delaying the second clock signal S102 by ¾ clock, and the delay element 107 outputs a delayed clock S107 that is obtained by delaying the second clock signal S102 by one clock.

These delayed clocks S104 to S107 which are shifted in phase with each other by ¼ clock are inputted to the selector 108. The selector 108 selects one of the delayed clocks S104 to S107 which is the most phase-synchronized with the reference signal S103 inputted through the reference signal input terminal 103, and outputs phase information S108 of the selected delay clock to the factor control circuit 109. The phase information S108 is converted into an interpolation factor S109 by the factor control circuit 109. It is possible to set the interpolation factor S109 at ¼ when the delayed clock S104 from the delay element 104 is selected, ²⁄₄ when the delayed clock S105 from the delay element 105 is selected, ¾ when the delayed clock S106 from the delay element 106 is selected, and 1 when the delayed clock S107 from the delay element 107 is selected. FIG. 3 shows a case where the delay clock S106 is selected as a clock that is the most phase-synchronized with the reference signal S103. In this case, ¾ is outputted as the interpolation factor S109.

On the other hand, video data that are written in the memory 110 are read in accordance with the second clock signal S102 as an output video data signal S110. Therefore, the clock with which the output video data signal S110 is synchronized is changed from the first clock signal S101 to the second clock signal S102. The output video data signal S110 that is read in accordance with the changed clock is inputted to the interpolation circuit 111. The interpolation circuit 111 performs data interpolation to the output video data signal S110 using the second clock signal S102 and the interpolation factor S109, and outputs an output video signal data signal S1 that is in phase with the reference signal S103 to outside through the video signal output terminal 114.

Here, the interpolation performed by the interpolation circuit 111 will be described with reference to FIGS. 2 and 3.

Initially, the delay circuit 201 delays the output video data signal S110 from the memory 110 and outputs a delay circuit output signal S201 that is delayed by one period of the second clock signal S102. Then, the subtraction circuit 202 calculates a difference between the output video data signal S110 and the delay circuit output signal S201. The multiplication circuit 203 multiplies the calculated subtraction circuit output signal S202 by the interpolation factor S109. Further, the addition circuit 204 adds the delay circuit output signal S201 and a multiplication circuit output signal S203 from the multiplication circuit 203, and outputs an output video data signal S111 including the output video data. This arithmetic can be expressed by a following formula:

$$S111=(S110-S201)\times S109+S201.$$

According to this formula, between two data having a time difference corresponding to one period of the second clock signal S102, the interpolation based on the phase difference factor (interpolation factor S109) can be performed, i.e., phase synchronization can be performed.

More specifically, as shown in FIG. 3, when a video data signal S100 including video data in the order of "10", "20", . . . is inputted through the video signal input terminal 100, and the output video data signal S110 includes the video data "20", the delay circuit output signal S201 includes the video data "10". When the subtraction circuit 202 calculates a difference between the output video data signal S110 and the delay circuit output signal S201, a difference value (subtraction circuit output signal S202) 10 is obtained. At this time, the interpolation factor S109 is ¾, and the result of the multiplication between the subtraction circuit output signal S202 and the interpolation factor S109 in the multiplication circuit 203 (i.e., multiplication circuit output signal S203) is 7.5. The addition circuit 204 adds the multiplication circuit output signal S203 to the delay circuit output signal S201, thereby obtaining 17.5, which is output video data included in the output video data signal S111.

Next, the effect of the interpolation performed by the interpolation circuit 111 will be described with reference to FIGS. 3 to 6. Hereinafter, the description will be given assuming that a video data signal S100 including video data for displaying a vertical line on a screen as shown in FIG. 6(a) is inputted to the video signal processor.

Figure 4:
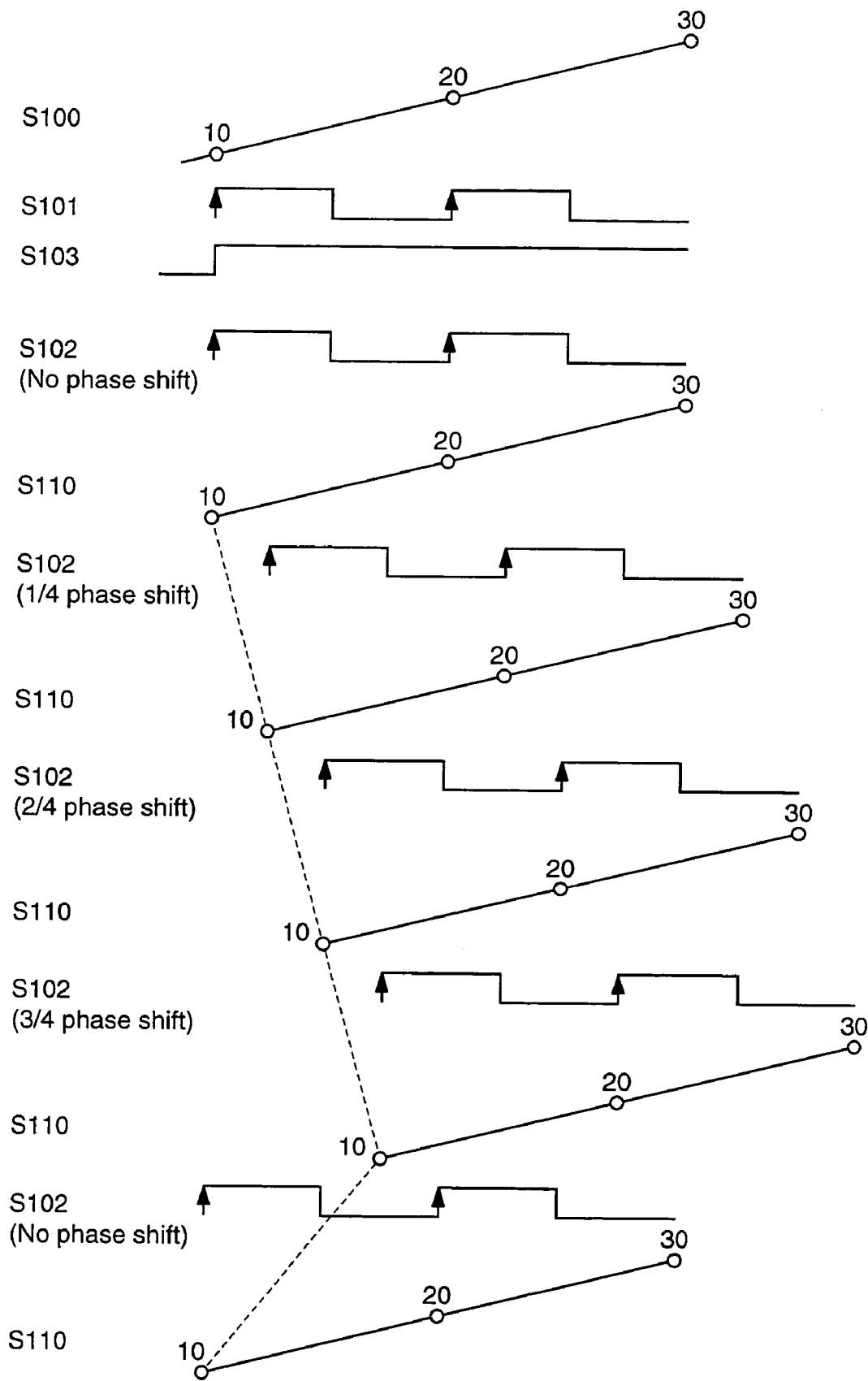
FIG. 4 is a timing chart showing a case where data are read from a memory without performing data interpolation to a reference signal.
Figure 6A:
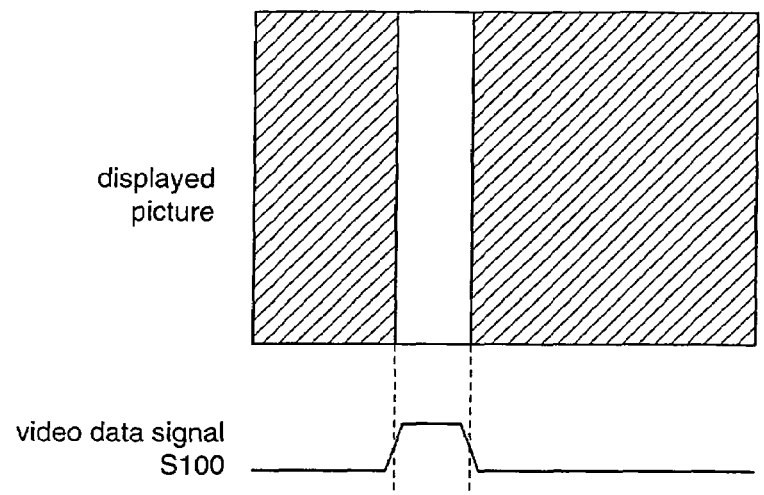
FIG. 6(a) is a diagram showing an example of a video data signal inputted through a video signal input terminal and a picture that is displayed on a monitor screen based on the video data signal.
Figure 6B:
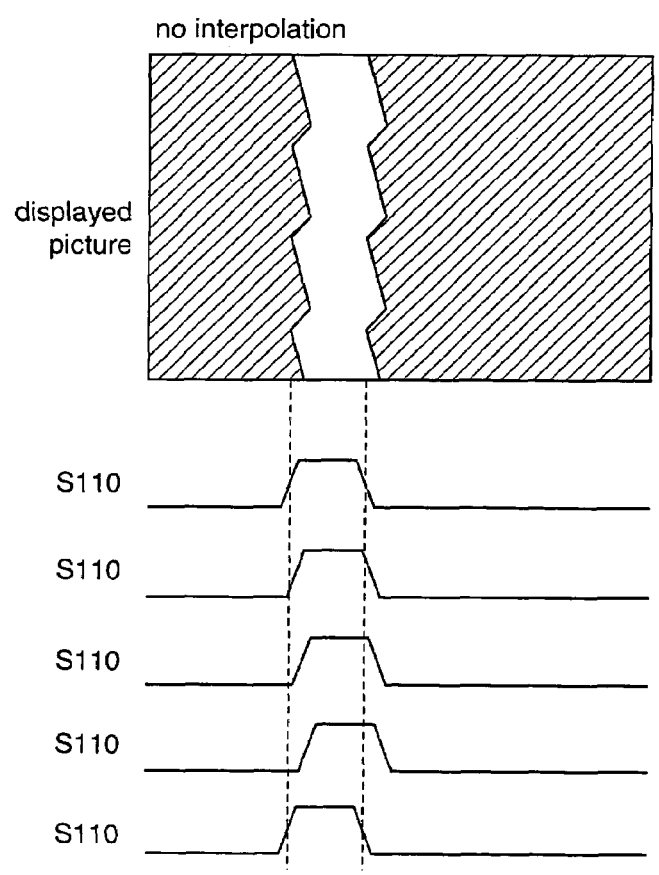
FIG. 6(b) is a diagram showing an example of video data signals read from the memory, and a picture that is displayed on a monitor screen based on the video data signal.

FIG. 4 shows a waveform of the output video data signal S110 when the phase synchronization with respect to the reference signal S103 by the data interpolation is not performed, i.e., video data are read from the memory 110 in accordance with the second clock signal S102. As shown in this figure, the second clock signal S102 inputted through the clock input terminal 102 sometimes may be out of phase with the reference signal S103, and the output video data signal S110 from the memory 110 may be out of phase accordingly. In such cases, as shown in FIG. 6(b), jitter occurs on a display screen and the vertical line is distorted by an amount corresponding to the shift of the second clock signal S102.

Figure 5:
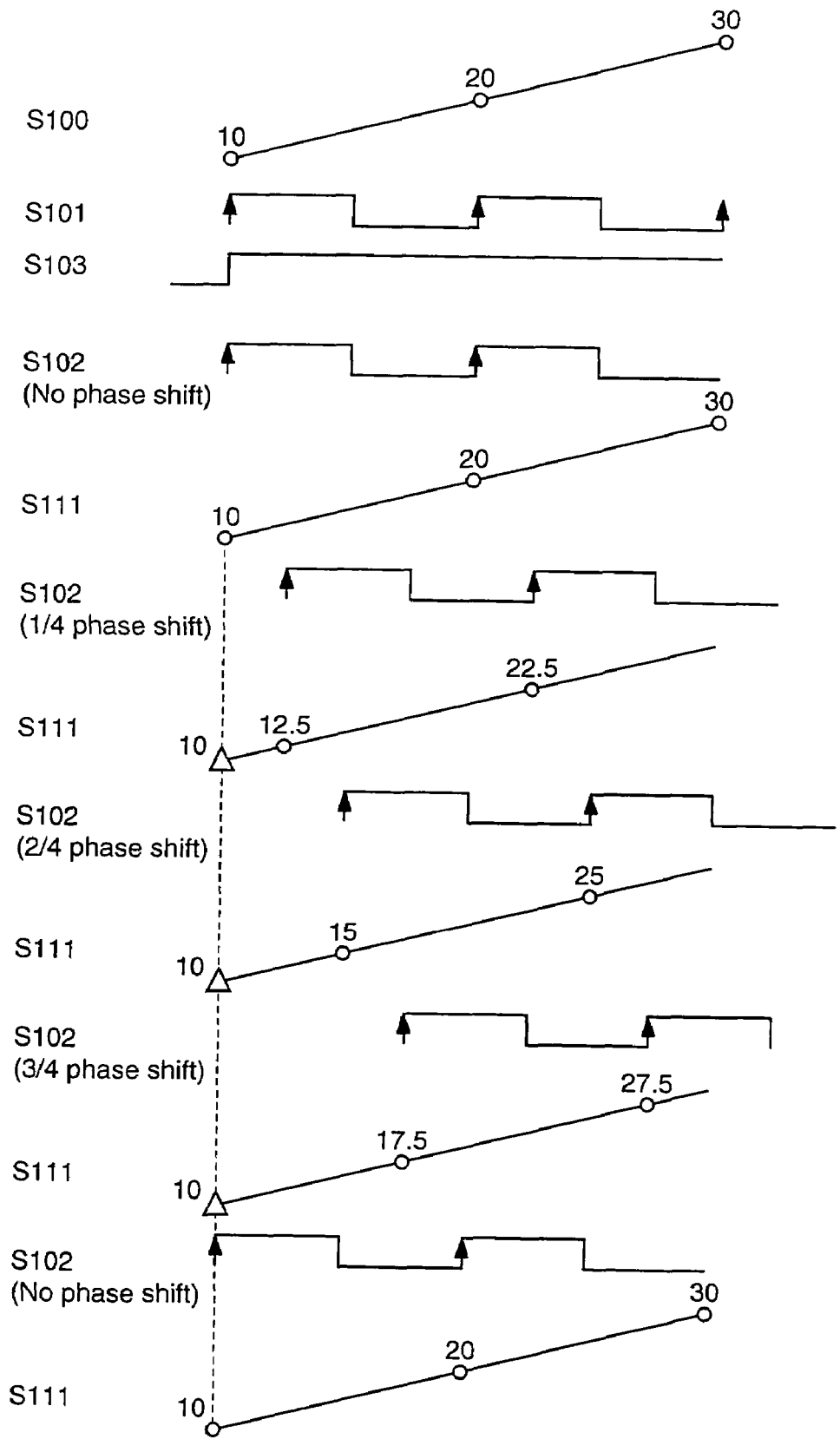
FIG. 5 is a timing chart showing a case where data are read from a memory with performing data interpolation to a reference signal.
Figure 6C:
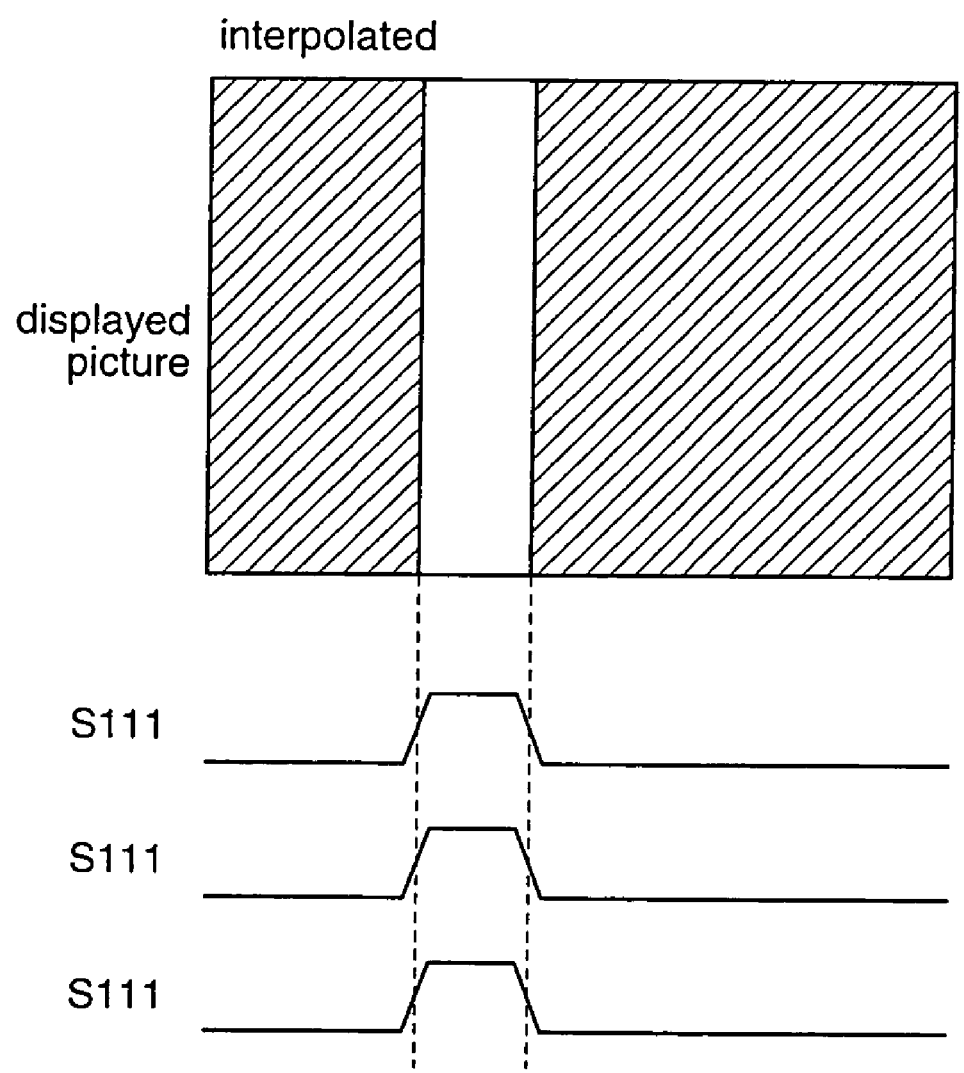
FIG. 6(c) is a diagram showing an example of output video data signals that are obtained by interpolating the video data signal read from the memory, and a picture displayed on a monitor screen based on the output video data signal.

On the other hand, a waveform of the output video data signal S111 when the phase synchronization with respect to the reference signal S103 by the data interpolation is performed, i.e., when the output video data signal S110 that is obtained by reading video data from the memory 110 in accordance with the second clock signal S102 is interpolated by the interpolation circuit 111 is shown in FIG. 5. As shown in this figure, the phase of the output video data signal S111 is shifted according to a shift amount of the second clock signal S102, thereby eliminating the phase shift in the second clock signal S102. In this case, as shown in FIG. 6(c), the display picture is not distorted and can be finely displayed.

As described above, the video signal processor according to the first embodiment includes the memory 110 that utilizes the first clock signal S101 as a writing clock for the video data signal S100 and the second clock signal S102 as a reading clock for the output video data signal S110, the delay elements 104 to 107 each phase shifting the second clock signal S102 by one-fourth of the clock, the control circuit 113 for controlling the respective delay values of the delay elements 104 to 107 on the basis of the result of the comparison by the phase comparator 112, the selector 108 for selecting one of the delayed clocks S104 to S107 which have been delayed by the delay elements 104 to 107, which is the most phase-synchronized with the reference signal S103 inputted from outside and outputting phase information S108 of the selected delayed clock, the factor control circuit 109 for converting the phase information S108 into an interpolation factor S109, and the interpolation circuit 111 for interpolating the output video data signal S110 that is read from the memory 110 in accordance with the second clock signal S102 using the interpolation factor S109, and outputting the output video data signal S111. Therefore, when the clock is changed so as to be in phase with the reference signal S103, it is possible to prevent one period of the clock from becoming a length that is not within a specified range while selecting the clock that is in phase with the reference signal S103, whereby in LCD televisions and the like, it is possible to prevent a display picture from being displayed distorted. Further, since it is possible to prevent the period of the second clock signal S102 from being shortened, arithmetic errors in the video signal processor can be avoided.

Further, according to the video signal processor and the video signal processing method of the first embodiment, the second clock signal S102 is outputted through the clock output terminal 115 as it is. Therefore, when an arithmetic unit that employs a clock having the same frequency as the second clock signal S102 is connected at a later stage of the video signal processor, arithmetic errors or malfunction in the arithmetic unit can be also avoided.

Embodiment 2

A video signal processor and a video signal processing method according to a second embodiment of the present invention will be described.

The video signal processor according to the second embodiment does not interpolate the video data signal S100 using the second clock signal S102 but interpolates the output video data signal S110 using the first clock signal that is used to write the video data signal S100 in the memory 110.

Figure 7:
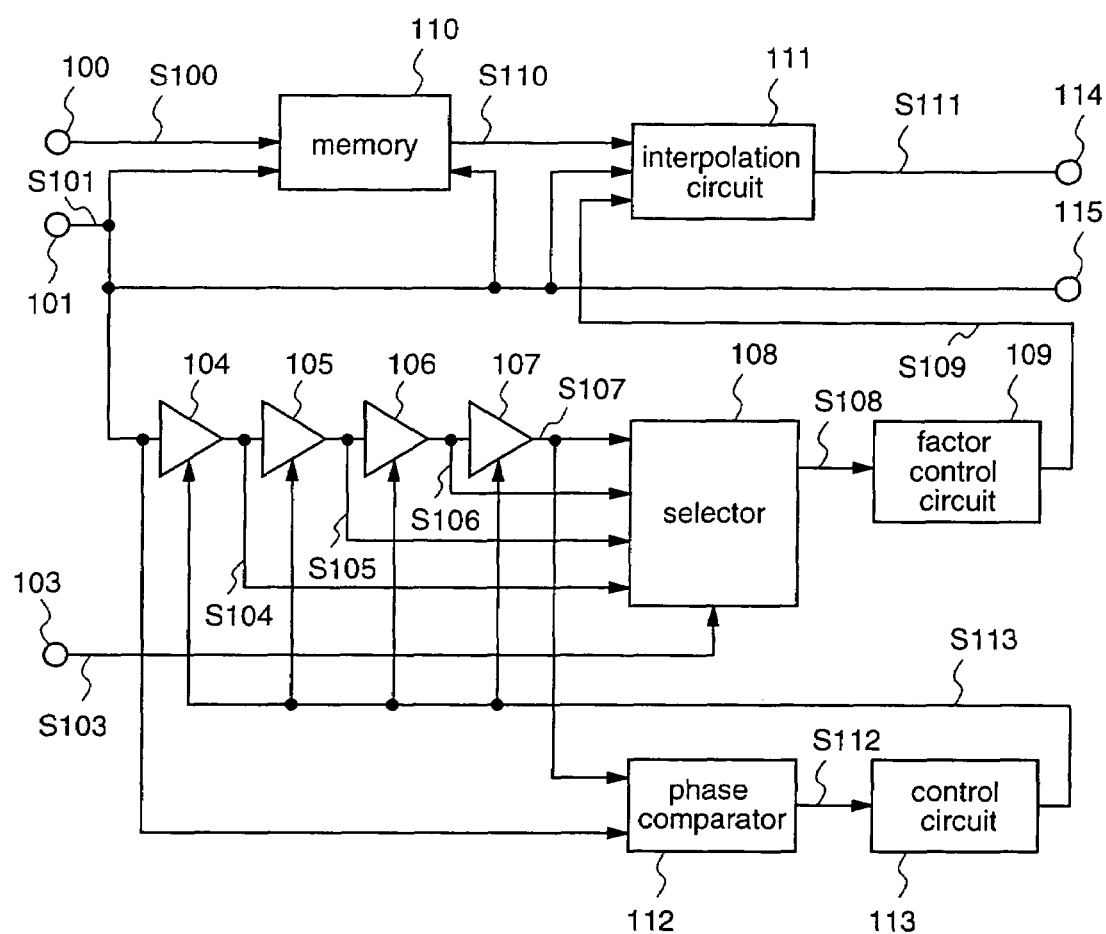
FIG. 7 is a block diagram illustrating a structure of a video signal processor according to a second embodiment of the present invention.
Figure 8:
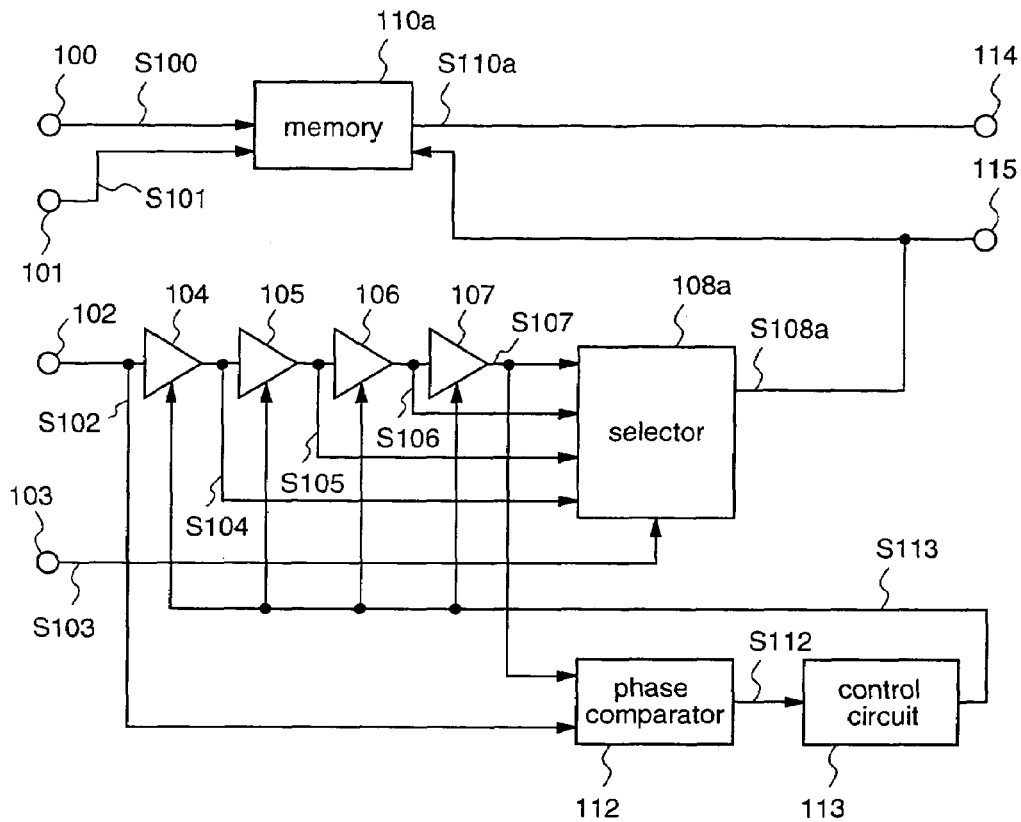
FIG. 8 is a block diagram illustrating a structure of a conventional video signal processor.
Figure 9:
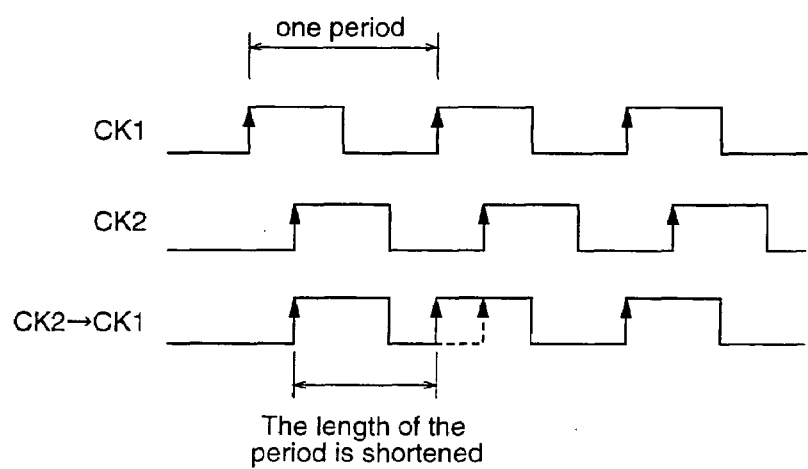
FIG. 9 is a diagram for explaining a case where the period of a clock is shortened at the switching of clocks.

FIG. 7 is a block diagram illustrating a structure of the video signal processor according to the second embodiment.

In FIG. 7, a video data signal S100 including video data is inputted to the video signal processor through a video signal input terminal 100. A first clock signal S101 is inputted through a clock input terminal 101. A reference signal S103 is inputted through a reference signal input terminal 103.

Plural delay elements 104 to 107 can vary respective delay values. The delay element 104 phase shifts the first clock signal S101 inputted through the clock input terminal 101 by ¼ clock. The delay elements 105, 106, and 107 each phase shift a delayed clock inputted from the preceding delay element, by ¼ clock. A selector 108 selects one of the delayed clocks S104 to S107 which have been delayed by the respective delay elements 104 to 107, which is the most synchronized with the reference signal S103, and outputs phase information S108 of the selected delayed clock to a factor control circuit 109. The factor control circuit 109 outputs an interpolation factor S109 for the output video data signal S110 on the basis of the phase information S108. A phase comparator 112 compares the phases between a delayed clock that is obtained by delaying a focus clock in the first clock signal S101 by one clock using the delay elements 104 to 107, and a clock that is one clock later than the focus clock. A control circuit 113 outputs a control signal S113 for controlling the respective delay values of the delay elements 104 to 107 on the basis of a phase difference output S112 from the phase comparator 112.

Writing and reading into/from a memory 110 can be performed independently. This memory 110 utilizes the first clock signal S101 for writing the video data signal S100 and reading the output video data signal S110. An interpolation circuit 111 interpolates the output video data signal S110 using the interpolation factor S109. The output video data signal S111 that has been interpolated by the interpolation circuit 111 is outputted through a video signal output terminal 114, and the first clock signal S101 is outputted through a clock output terminal 115.

The operation of the video signal processor that is constructed as described above and the video signal processing method will be described.

The first clock signal S101 is inputted through the clock input terminal 101. This first clock signal S101 is inputted to the delay element 104 and the memory 110, and outputted from the clock output terminal 115.

When a video data signal S100 including video data is inputted through the video signal input terminal 100, the video data are stored in the memory 110 in accordance with the first clock signal 101.

The first clock signal S101 inputted to the delay element 104 is delayed successively by the delay elements 104 to 107, resulting in a delayed clock S107, which is obtained by delaying the first clock signal S101 by approximately one clock.

This delayed clock S107 is inputted to the phase comparator 112 as a comparison signal, and a clock that is one clock later than the clock inputted to the clock input terminal 101 is inputted to the phase comparator 112 as a signal to be compared (hereinafter, referred to as a to-be-compared signal). The phase comparator 112 compares the comparison signal and the to-be-compared signal, thereby obtaining a phase difference, and outputs a phase difference output S112 to the control circuit 113. The control circuit 113 outputs a control signal S113 for controlling the respective delay values of the delay elements 104 to 107 on the basis of the phase difference output S112.

When this operation for controlling the respective delay values of the delay elements 104 to 107 on the basis of the phase difference between the delayed clock S107 that is obtained by delaying the first clock signal S101 by one clock, and a clock that is one clock later than the first clock signal S101 is repeatedly performed until the phase comparator 112 detects no phase difference, the respective delay values of the delay elements 104 to 107 become approximately the same. At this time, the delay element 104 outputs a delayed clock S104 that is obtained by delaying the first clock signal S101 by ¼ clock, the delay element 105 outputs a delayed clock S105 that is obtained by delaying the first clock signal S101 by 2/4 clock, the delay element 106 outputs a delayed clock S106 that is obtained by delaying the first clock signal S101 by ¾ clock, and the delay element 107 outputs a delayed clock S107 that is obtained by delaying the first clock signal S101 by one clock.

These delayed clocks S104 to S107 are inputted to the selector 108. The selector 108 selects one of the delayed clocks S104 to S107, which is the most phase-synchronized with the reference signal S103 inputted through the reference signal input terminal 103, and outputs phase information S108 of the selected delayed clock to the factor control circuit 109. This phase information S108 is converted into an interpolation factor S109 by the factor control circuit 109.

On the other hand, the video data written into the memory 110 are read as an output video data signal S110 in accordance with the first clock signal S101, and inputted to the interpolation circuit 111. The interpolation circuit 111 performs data interpolation to the output video data signal S110 using the first clock signal S101 and the interpolation factor S109, and outputs an output video data signal S111 that is made in phase with the reference signal S103 to outside through the video signal output terminal 114.

As described above, the video signal processor according to the second embodiment includes the memory 110 which utilizes the first clock signal S101 as a writing clock for the video data signal S100 and a reading clock for the output video data signal S110, the delay elements 104 to 107 each delaying the first clock signal S101 successively by ¼ clock, the control circuit 113 which controls the respective delay values of the delay elements 104 to 107 on the basis of the result of the comparison by the phase comparator 112, the selector 108 which selects one of the delayed clocks S104 to S107, delayed by the delay elements 104 to 107, that is the most synchronized with the reference signal S103 inputted from outside, and outputs phase information S108 of the selected delayed clock, the factor control circuit 109 which converts the phase information S108 into the interpolation factor S109, and the interpolation circuit 111 which interpolates the output video data signal S110 read from the memory 110 in accordance with the first clock signal S101, using the interpolation factor S109 and outputs the output video data signal S111. Therefore, in changing the clock so as to be in phase with the reference signal S103, it is possible to prevent one period of the clock from becoming a length that is not within a specified range. Further, an arithmetic error or malfunction in the video signal processor resulting from the reduction of the period of the clock can be avoided.

Further, according to the video signal processor and the video signal processing method of the second embodiment, the memory 110 utilizes the first clock signal S101 as a writing clock for the video data signal S100 and a reading clock for the output video data signal S110, and the interpolation of the output video data signal S110 is performed using the first clock signal S101. Therefore, when an apparatus that performs signal processing using a clock at the same frequency as the first clock signal S101 is connected in a later stage of the video signal processor or when the output signal is outputted as an analog signal independently of the frequency of a clock in a later stage, only the first clock signal S101 is inputted to the video signal processor, whereby the video signal processor can be constructed with a simpler structure. Thus, a structure of the video signal processor in a picture-tube type television receiver can be simplified.

In the first and second embodiments, the second clock signal S102 or the first clock signal S101 is delayed by one clock using the four delay elements 104 to 107. However, it is possible to provide N delay elements (N is an integer that is one or larger) and delay an inputted clock by 1/N clock by each of the delay elements.

In the first and second embodiment, the respective delay values of the delay elements are made equal. However, it is not necessary that the delay values of the delay elements are equal. When the total delay value of all delay elements is set at one clock and the factor control circuit 109 sets the interpolation factor S109 in consideration of the respective delay values of the delay elements, it is also possible to obtain the output video data signal S111 that is in phase with the reference signal S103.

Further, the factor control circuit 109 may stabilize the value of the interpolation factor S109 by filtering the phase information S108.

What is claimed is:

1. A video signal processor comprising:
a memory that utilizes a first clock signal for writing a video data signal to the memory and a second clock signal for reading a video data signal from the memory;
a delay unit, including plural delay elements, for delaying the second clock signal;
a selector for selecting a clock that is most synchronized with a reference signal inputted from outside, from among clocks that have been delayed by the delay elements, respectively, and outputting phase information of the selected clock;
an interpolation factor output unit for converting the phase information into an interpolation factor, and outputting the interpolation factor; and
an interpolator for interpolating the video data signal read from the memory in accordance with the second clock signal using the interpolation factor.

2. A video signal processor comprising:
a memory that utilizes a first clock signal for writing a video data signal to the memory and a second clock signal for reading a video data signal from the memory;
a delay unit, including plural delay elements having respective variable delay values, for delaying the second clock signal by one period of the second clock signal;
a phase comparator for comparing phases between a clock that is obtained by delaying a focus clock in the second clock signal by one clock using the delay unit, and a clock that is one clock later in the second clock signal than the focus clock;
a controller for controlling the respective variable delay values of the delay elements of the delay unit on the basis of a phase difference detected by the phase comparator;
a selector for selecting a clock that is most synchronized with a reference signal inputted from outside, from among clocks that have been delayed by the delay elements, respectively, and outputting phase information of the selected clock;
an interpolation factor output unit for converting the phase information into an interpolation factor, and outputting the interpolation factor; and an interpolator for interpolating the video data signal read from the memory in accordance with the second clock signal using the interpolation factor.

3. A video signal processor comprising:

a memory that utilizes a first clock signal for writing a video data signal to the memory or reading a video data signal from the memory;

a delay unit, including plural delay elements, for delaying the first clock signal;

a selector for selecting a clock that is most synchronized with a reference signal inputted from outside, from among clocks that have been delayed by the delay elements, respectively, and outputting phase information of the selected clock;

an interpolation factor output unit for converting the phase information into an interpolation factor, and outputting the interpolation factor; and an interpolator for interpolating the video data signal read from the memory in accordance with the first clock signal using the interpolation factor.

4. A video signal processor comprising:

a memory that utilizes a first clock signal for writing a video data signal to the memory or reading a video data signal from the memory;

a delay unit, including plural delay elements having respective variable delay values, for delaying the first clock signal by one period of the first clock signal;

a phase comparator for comparing phases between a clock that is obtained by delaying a focus clock in the first clock signal by one clock using the delay unit, and a clock that is one clock later in the first clock signal than the focus clock;

a controller for controlling the respective variable delay values of the delay elements of the delay unit on the basis of a phase difference detected by the phase comparator;

a selector for selecting a clock that is most synchronized with a reference signal inputted from outside, from among clocks that have been delayed by the delay elements, respectively, and outputting phase information of the selected clock;

an interpolation factor output unit for converting the phase information into an interpolation factor, and outputting the interpolation factor; and an interpolator for interpolating the video data signal read from the memory in accordance with the first clock signal using the interpolation factor.

5. A video signal processing method comprising:

writing a video data signal into a memory in accordance with a first clock signal;

delaying a second clock signal using plural delay elements;

selecting a clock that is most synchronized with a reference signal inputted from outside, from among clocks that have been delayed by the delay elements, respectively, and generating phase information of the selected clock;

converting the phase information into an interpolation factor; and interpolating the video data signal read from the memory in accordance with the second clock signal using the interpolation factor.

* * * * *